(12) United States Patent
Motosugi

(10) Patent No.: US 9,583,310 B2
(45) Date of Patent: Feb. 28, 2017

(54) CHARGED PARTICLE BEAM WRITING APPARATUS, CHARGED PARTICLE BEAM WRITING METHOD, AND SHOT CORRECTION METHOD OF CHARGED PARTICLE BEAM WRITING METHOD

(71) Applicant: NuFlare Technology, Inc., Yokohama (JP)

(72) Inventor: Tomoo Motosugi, Kanagawa (JP)

(73) Assignee: NuFlare Technology, Inc., Yokohama (JP)

(*) Notice: Subject to any disclaimer, the term of this patent is extended or adjusted under 35 U.S.C. 154(b) by 0 days.

(21) Appl. No.: 14/879,518

(22) Filed: Oct. 9, 2015

(65) Prior Publication Data

US 2016/0111252 A1   Apr. 21, 2016

(30) Foreign Application Priority Data

Oct. 20, 2014 (JP) .................................. 2014-213726

(51) Int. Cl.
*A61N 5/00* (2006.01)
*H01J 37/317* (2006.01)
*H01J 37/304* (2006.01)

(52) U.S. Cl.
CPC ...... *H01J 37/3174* (2013.01); *H01J 37/3045* (2013.01); *H01J 2237/30433* (2013.01);
(Continued)

(58) Field of Classification Search
CPC .......... H01J 37/00; H01J 37/02; H01J 37/302; H01J 37/3023; H01J 37/3026; H01J 37/3174; H01J 37/3177
(Continued)

(56) References Cited

U.S. PATENT DOCUMENTS

2002/0142233 A1   10/2002 Inoue
2007/0120056 A1*   5/2007 Nagatomo ............. B82Y 10/00
250/310

(Continued)

FOREIGN PATENT DOCUMENTS

CN   100578512 C   1/2010
JP   09-186070   7/1997
(Continued)

OTHER PUBLICATIONS

Office Action mailed Oct. 21, 2016 in Taiwanese Application No. 104130147 (w/English translation).

*Primary Examiner* — Jason McCormack
(74) *Attorney, Agent, or Firm* — Oblon, McClelland, Maier & Neustadt, L.L.P.

(57) ABSTRACT

In a charged particle beam writing apparatus, a charged particle optical system includes a first, second, and third deflection control system configured to form a shot of a charged particle beam, control a shape and size of the shot, and control an irradiation position of the shot respectively. A shot data generation processing device generates shot data of writing a latent image on a resist layer in a sample, using (1) design data of a pattern to be formed in a member, wherein the member is formed in a sample, and the resist layer is formed on the member, and (2) correction information of a shot size and an irradiation shot position obtained from in-plane distribution data of an XY dimension variation amount of dimension measurement patterns. The dimension measurement patterns are formed by writing test patterns on a resist layer and transferring the test patterns onto a member.

20 Claims, 6 Drawing Sheets

(52) U.S. Cl.
CPC ............... *H01J 2237/30455* (2013.01); *H01J 2237/31776* (2013.01); *H01J 2237/31796* (2013.01)

(58) Field of Classification Search
USPC .............................. 250/492.1, 492.2, 492.22
See application file for complete search history.

(56) References Cited

U.S. PATENT DOCUMENTS

| | | | |
|---|---|---|---|
| 2009/0168043 A1* | 7/2009 | Lee ................... | B82Y 10/00 355/77 |
| 2012/0061593 A1* | 3/2012 | Kawase ............. | B82Y 10/00 250/492.3 |
| 2013/0256519 A1* | 10/2013 | Kato .................. | H01J 37/3026 250/252.1 |

FOREIGN PATENT DOCUMENTS

| | | |
|---|---|---|
| JP | 2002-296754 | 10/2002 |
| JP | 2012-114105 | 6/2012 |
| TW | 201332605 A1 | 8/2013 |

\* cited by examiner

CHARGED PARTICLE BEAM WRITING APPARATUS, CHARGED PARTICLE BEAM WRITING METHOD, AND SHOT CORRECTION METHOD OF CHARGED PARTICLE BEAM WRITING METHOD

CROSS-REFERENCE TO THE RELATED APPLICATION

The entire disclosure of the Japanese Patent Application No. 2014-213726, filed on Oct. 20, 2014 including specification, claims, drawings, and summary, on which the Convention priority of the present application is based, are incorporated herein in its entirety.

FIELD OF THE INVENTION

The present invention relates to a charged particle beam writing apparatus, a charged particle beam writing method, and a shot correction method of a charged particle beam writing method.

BACKGROUND

A charged particle beam writing apparatus writes a latent image having a predetermined shape onto a resist layer that is a base material of an etching mask or the like by irradiating a charged particle beam, such as an electronic beam. Since the charged particle beam writing apparatus can write the latent image with high resolution, the charged particle beam writing apparatus is used to produce an original pattern with high-resolution (also referred to as a reticle or a mask).

For example, when a latent image of a fine pattern is written onto the resist layer by a variable shaped beam type electron beam writing apparatus, figure allocation is performed, which enables construction of a planar shape of the latent image to be written by a combination of a plurality of figures using information on a cross-sectional beam shape and a cross-sectional size which can be shaped by the electron beam writing apparatus, and design data of the latent image to be written. Each of the figures used in the figure allocation has a shape and a size which enable writing by irradiating one shot of the electron beam or by sequentially irradiating a plurality of shots of the electron beam. Next, with respect to each of allocated figures, shot division to allocate one or a plurality of shots for writing a relevant figure is performed. Thereafter, a shot of which a gain or offset of the size needs to be corrected is extracted from all shots allocated through the shot division and a correcting step is performed to set a correction amount of the shot. Thereby, shot data indicating control information of an electron beam in the case of writing a latent image is generated. The electron beam is controlled according to the shot data so as to write the latent image of a fine pattern on the resist layer.

In order to increase writing precision of the latent image, a method of evaluating dimension precision of a charged particle beam has been already proposed. Also, a charged particle beam writing apparatus capable of increasing the writing precision of the latent image by resizing a predetermined shot has been already proposed.

For example, in the variable shaped beam estimation method disclosed in Japanese Laid-Open Patent Publication No. H09-186070, a plurality of rectangular patterns 1 having an identical dimension are prepared. At least one of these rectangular patterns is used for writing by a single electron beam shot, and the other rectangular patterns are divided by a line (deviation line) parallel to one side of the rectangular pattern to be used for writing by two electron beam shots. In the patterns obtained by a developing step after the writing step, a width of a pattern in the perpendicular direction to the deviation line is measured by a pattern dimension measuring apparatus. Then, the dimension accuracy of the variable shaped beam is estimated by examining a relationship between the measurement value of the pattern dimension, the presence or absence of the deviation line, or the position of the deviation line. According to this variable shaped estimation method, a displacement amount of a gain and offset can be accurately estimated, thereby a shot having a size equal to the maximum size or less can be shaped accurately.

In addition, Japanese Laid-Open Patent Publication No. 2012-114105 discloses a charged particle beam writing apparatus, which extracts a predetermined figure and resizes the figure in consideration of dimension variation upon figure allocation, in order to prevent a dimension of a fine pattern actually written in a resist layer from varying from a design dimension, due to a loading effect or the like which inevitably occurs when a developing step is performed to a latent image written on the resist layer.

For example, a photo mask is manufactured by writing a latent image of a fine pattern on a resist layer provided in a mask blank and by transferring the latent image onto a light shielding film of the mask blank using a charged particle beam writing apparatus. That is, the photo mask is manufactured by obtaining an etching mask by developing the resist layer in which the latent image is written, and by forming the fine pattern corresponding to the latent image with dry etching to the light shielding film of the mask blank through the etching mask. In this case, a manufacturing error in a dimension of the fine pattern formed in the light shielding film may be caused in the entire photo mask even though a shot in the charged particle beam apparatus is adjusted such that the latent image having desired dimension precision is written on a predetermined portion on the resist layer.

A manufacturing error value in an X direction of the fine pattern (i.e., a direction corresponding to an X-axis direction in a precision stage during the writing of the latent image) and a manufacturing error value in a Y direction of the fine pattern (i.e., a direction corresponding to a Y-axis direction in the precision stage during the writing of the latent image) are not uniform on the plane of the photo mask. On the plane of the photo mask, a difference between the manufacturing error value in the X direction and the manufacturing error value in the Y direction (hereinafter, referred to as an "XY dimension variation amount") is inevitably changed by a formation position of the fine pattern. That is, distribution of the XY dimension variation amount occurs on the plane of the photo mask.

It is experimentally demonstrated that distribution of the XY dimension variation amount on the plane of the photo mask is changed depending on a material of the resist layer on which the latent image is written by a charged particle beam or a material of the light shielding film which is an underlayer of the resist layer. Also, it is experimentally demonstrated that, when the respective materials of the resist layer and the light shielding film are fixed, the distribution is changed according to a development condition in the case of developing the latent image written on the resist layer or a dry etching condition in the case of patterning the light shielding film using an etching mask generated from a photo resist layer on which the latent image is written. In addition, it is experimentally demonstrated that, when the respective materials of the resist layer and the light shielding film, and the development condition or the etching condition are fixed, reproducibility is observed in the distribution of the XY dimension variation amount between manufactured photo masks.

In this regard, it is estimated that the distribution of the XY dimension variation amount on the plane of the photo mask is caused by occurrence of distribution of angles at which the developer is introduced into the resist layer and distribution of directions in which the developer flows when the resist layer after writing of the latent image is developed, or is caused by interaction of spatial density distribution of plasma and flow of an etching gas, which occurs in the case of dry etching on the light shielding film using the etching mask generated from the resist layer after writing of the latent image.

Therefore, it is difficult to reduce the XY dimension variation amount in the fine pattern formed in the photo mask over the entire surface of the photo mask even though a shot having high dimension precision is formed by the charged particle beam writing apparatus and the latent image is written on the resist layer by using an evaluation result of an evaluating method disclosed in Japanese Laid-Open Patent Publication No. H09-186070. Similarly, it is difficult to reduce the XY dimension variation amount in the fine pattern formed in the photo mask over the entire surface of the photo mask although a predetermined figure is extracted in the case of figure allocation and the figure is resized as disclosed in JP 2012-114105 A.

An object of the present invention is to provide a charged particle beam writing apparatus that can reduce a XY dimension variation amount in a fine pattern formed by transferring a latent image onto a member to be patterned, over the entire surface of the member to be patterned when a latent image of a fine pattern is written onto a resist layer formed on the member to be patterned by a charged particle beam.

Another object of the present invention is to provide a charged particle beam writing method that can reduce a XY dimension variation amount in a fine pattern formed by transferring a latent image onto a member to be patterned, over the entire surface of the member to be patterned when a latent image of a fine pattern is written onto a resist layer formed on the member to be patterned by a charged particle beam.

Further another object of the present invention is to provide a shot correction method of a charged particle beam writing method that can reduce a XY dimension variation amount in a fine pattern formed by transferring a latent image onto a member to be patterned, over the entire surface of the member to be patterned when a latent image of a fine pattern is written onto a resist layer formed on the member to be patterned by a charged particle beam.

SUMMARY OF THE INVENTION

According to one aspect of the present invention, a charged particle beam writing apparatus includes a charged particle optical system. The charged particle optical system includes a first deflection control system configured to form a shot of a charged particle beam by a blanking deflector and a first shaping aperture. The charged particle optical system further includes a second deflection control system configured to control a shape and a size of the shot by a shaping deflector and a second shaping aperture. The charged particle optical system further includes a third deflection control system configured to control an irradiation position of the shot, of which the shape and the size are controlled, by at least one objective deflector. A shot data generation processing device is provided to generate shot data in a case of writing a latent image on a resist layer in a sample, by using (1) design data of a pattern to be formed in a member. The member to be patterned is formed in a sample, and the resist layer is formed on the member to be patterned, and (2) correction information of a size and an irradiation shot position which are obtained from an in-plane distribution data of an XY dimension variation amount of a plurality of dimension measurement patterns. The plurality of dimension measurement patterns are formed by writing using the charged particle beam, a plurality of test patterns on a resist layer of a test sample having a layer configuration corresponding to the sample and, thereafter, transferring the plurality of test patterns onto a member to be patterned that is provided in the test sample. A deflection control device is provided to respectively control formation of the shot, the shape and the size of the shot, and the irradiation position of the shot, by adjusting respective driving voltages of the blanking deflector, the shaping deflector, and the at least one objective deflector according to the shot data.

According to another aspect of the present invention, a writing method using a charged particle beam includes generating base data. In a base data generating step, base data is generated that is a base of shot data used in a case of writing a latent image on a resist layer in a sample by a charged particle beam using design data of a pattern to be formed in a member that is provided in the sample. The resist layer is formed on the member to be patterned. In a data correcting step, the base data is corrected by writing a plurality of test patterns on a resist layer in a test sample having a layer configuration corresponding to the sample by a charged particle beam, transferring the plurality of test patterns onto a member to be patterned that is provided in the test sample to form a plurality of dimension measurement patterns, measuring an XY dimension difference for each of the plurality of dimension measurement patterns to obtain in-plane distribution data of an XY dimension variation amount, and generating correction information of a shot size and an irradiation shot position using the in-plane distribution data of the XY dimension variation amount. In a writing step, a latent image corresponding to the pattern is written on the resist layer in the sample, by sequentially irradiating the charged particle beam on the resist layer in the sample shot by shot, according to the shot data obtained by correcting the base data in the data correcting step.

According to another aspect of the present invention, a shot correction method of a charged particle beam writing method includes generating base data. In a base data generating step, base data is generated that is a base of shot data used in a case of writing a latent image on a resist layer in a sample by a charged particle beam using design data of a pattern formed in a member that is provided in the sample. The resist layer is formed on the member to be patterned. In a data correcting step, base data is corrected by writing a plurality of test patterns on a resist layer in a test sample having a layer configuration corresponding to the sample by a charged particle beam, transferring the plurality of test patterns onto a member to be patterned in the test sample to form a plurality of dimension measurement patterns, measuring an XY dimension difference for each of the plurality of dimension measurement patterns to obtain in-plane distribution data of an XY dimension variation amount, and generating correction information of a shot size and an irradiation shot position using the in-plane distribution data of the XY dimension variation amount.

DETAILED DESCRIPTION OF THE EMBODIMENT

First Embodiment

Figure 1:
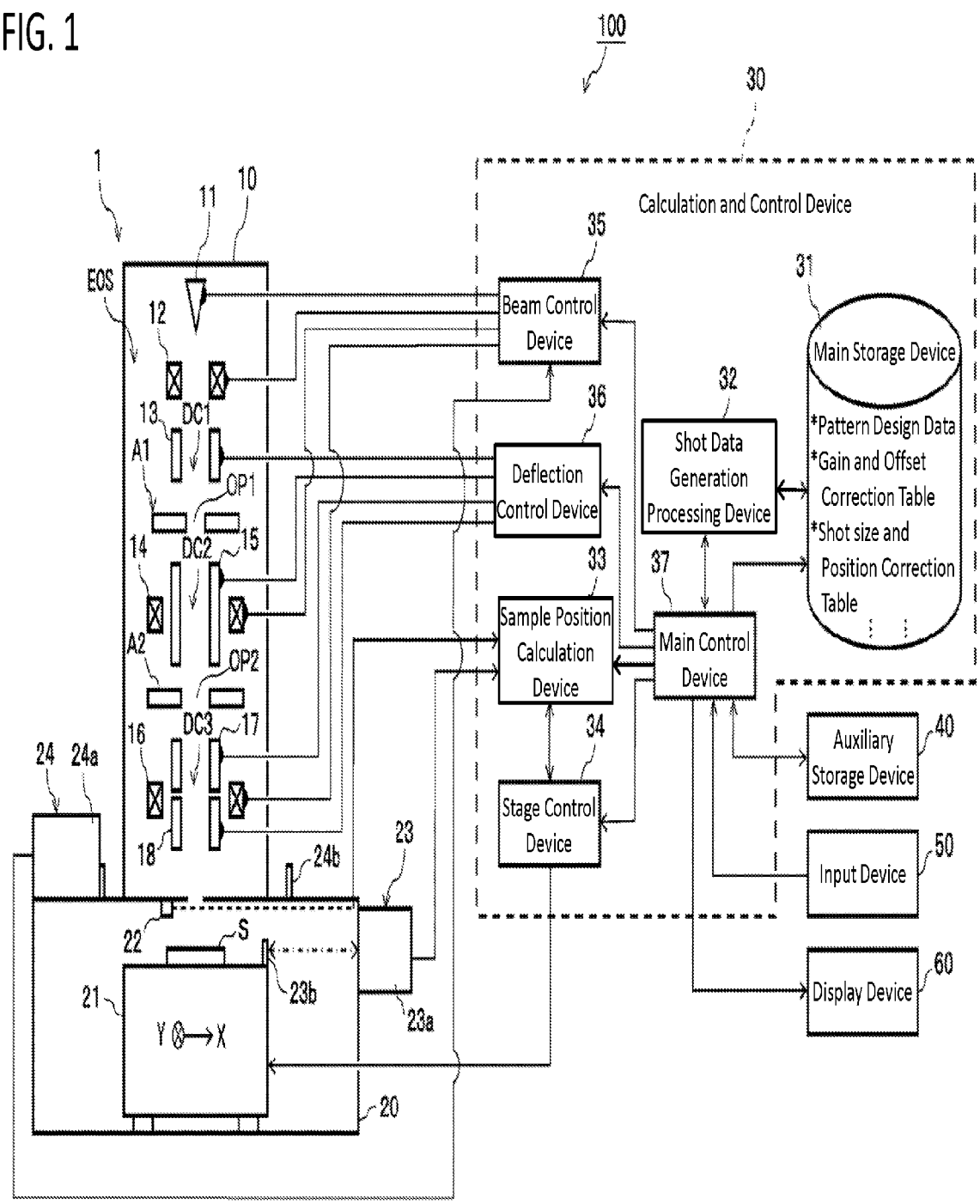
FIG. 1 is a schematic view illustrating a main part of an electron beam writing apparatus of one example of a charged particle beam writing apparatus according to the first embodiment.

FIG. 1 is a schematic view illustrating a main part of a charged particle beam writing apparatus, specifically an electron beam writing apparatus. In FIG. 1, an electron beam writing apparatus 100 includes a writing apparatus body 1, a calculation and control device 30, an auxiliary storage device 40, an input device 50, and a display device 60. Each component of the electron beam writing apparatus 100 will be described below.

The writing apparatus body 1 includes an electron optical column 10 and a writing chamber 20. In the electron optical column 10, a charged particle beam optical system, specifically an electron optical system EOS is provided. The electron optical system EOS includes an electron gun 11, a focusing lens 12, a blanking deflector 13, a first shaping aperture A1, a projection lens 14, a shaping deflector 15, a second shaping aperture A2, an objective lens 16, a sub objective deflector 17, and a main objective deflector 18. Further, in the writing chamber 20, a precision stage 21 and an image acquiring device 22 are provided. Located outside of the writing chamber 20, a length measuring device body 23a of a laser length measuring device 23, and height detecting device 24 are provided.

The electron gun 11 constituting an electron optical system EOS functions as a charged particle source. The electron gun 11 emits solid-state electrons toward the air, accelerates the electrons by an electric field, and irradiates the electrons on a writing chamber 20. A focusing lens 12 is configured of an electron lens. The focusing lens 12 focuses the electrons emitted from the electron gun 11 to generate an electron beam with a predetermined current density satisfying the Kohler illumination conditions. The first shaping aperture A1 shapes a cross-sectional shape of the electron beam so as to have a shape corresponding to a planar shape of an opening portion OP1, the electron beam being formed by the focusing lens 12 and being irradiated on the opening portion OP1 of the first shaping aperture A1 and the proximity of the opening portion OP1. A blanking deflector 13 is configured by, for example, an electrostatic type deflector, and constitutes a first deflection control system DC1 along with the first shaping aperture A1. The first deflection control system DC1 controls a trajectory of the electron beam formed by the focusing lens 12 so as to be a trajectory along which the electron beam passes through the opening portion OP1 of the first shaping aperture A1 and a trajectory along which the electron beam is incident only to a non-opening portion of the first shaping aperture A1, thereby forming a shot of the electron beam.

A projection lens 14 is configured by an electron lens. The projection lens 14 projects an image of the opening portion OP1 onto a predetermined portion of a second shaping aperture A2, the image being formed by the electron beam (shot) passing through the opening portion OP1 of the first shaping aperture A1. A shaping deflector 15 is configured by, for example, an electrostatic type deflector, and constitutes a second deflection control system DC2 along with the second shaping aperture A2. The second deflection control system DC2 controls a shape and a size of the shot by deflecting a trajectory of the electron beam (shot) so as to be a trajectory along which the electron beam is incident to an opening portion OP2 of the second shaping aperture A2 and the proximity of the opening portion OP2.

Moreover, the opening portion OP2 of the second shaping aperture A2 has a heptagonal shape in such a way that, for example, on one corner of a rectangle, a rectangle smaller than the rectangle is superimposed on a plane. By controlling the trajectory of the electron beam (shot) by the second deflection control system DC2 such that a part of an image of the opening portion OP1 of the first shaping aperture A1 passes through a predetermined portion of the opening portion OP2 of the second shaping aperture A2, it is possible to shape the electron beam (shot) passing through the opening portion OP2 of the second shaping aperture A2 so as to have a rectangular or triangular shape having a desired size and a desired shape.

An objective lens 16 is configured by an electron lens. The objective lens 16 focuses the electron beam (shot) which has passed through the opening portion OP2 of the second shaping aperture A2. A sub objective deflector 17 and a main objective deflector 18 constitute a third deflection control system DC3. The sub objective deflector 17 is configured by, for example, an electrostatic deflector. The sub objective deflector 17 controls the trajectory of the electron beam (shot) focused by the objective lens 16 according to a deflection amount less than that by the main objective deflector 18. The main objective deflector 18 is configured by, for example, an electrostatic type deflector, and controls the trajectory of the electron beam (shot), controlled by the sub objective deflector 17, according to a deflection amount more than that by the sub objective deflector 17. The third deflection control system DC3 deflects the trajectory of the electron beam (shot) which has passed through the opening portion OP2 of the second shaping aperture A2 by the sub objective deflector 17 and the main objective deflector 18, thereby controlling an irradiation position of the shot. The electron beam (shot) is introduced into the inside of the writing chamber 20 after the trajectory of the electron beam (shot) is controlled by the sub objective deflector 17 and the main objective deflector 18, and is irradiated onto a predetermined portion of a sample S placed on the precision stage 21.

In addition, the sample S is not a component of the electron beam writing apparatus 100. The sample S has a resist layer on which a latent image is formed by the electron beam and a member to be patterned which becomes an underlayer of the resist layer. Specific examples of the member to be patterned include a mask blank, a semiconductor substrate, a semiconductor substrate having an upper surface on which a conductive film or an electric insulation film is provided, a silicon on glass (SOG) substrate having an upper surface on which a conductive film or an electric insulation film.

The precision stage 21, on which the sample S is positioned, is moveable along the X direction and Y direction, for example. The sample S is positioned on the upper surface of the precision stage 21. The image acquiring device 22 acquires an optical image of the sample S placed on the precision stage 21. Data of the optical image of the sample S, which is acquired by the image acquiring device 22, is used as information for displacing the precision stage 21 such that an alignment portion having been set in the sample S, for example, an alignment marker formed in a predetermined portion or a predetermined edge portion of the sample S, is placed at an alignment reference position of the electron beam writing apparatus 100. The alignment reference position can be, for example, a central portion of an image acquired by the image acquiring device 22.

A laser length measuring device 23 includes a length measuring device body 23a disposed outside the writing chamber 20 and two mirrors (only one mirror 23b is illustrated in FIG. 1) disposed on the precision stage 21, and measures a displacement amount in two dimensional directions of the precision stage 21, that is, a displacement amount in an X-axis direction and a displacement amount in a Y-axis direction by using a phase difference detection method. A height detecting device 24 includes a height detecting device body 24a and a projector 24b which are disposed outside the writing chamber 20. The height detecting device body 24a receives measurement light emitted from the projector 24b and reflected by a surface of the sample S, and detects a height position of an upper surface of the sample S.

The calculation and control device 30, which constitutes the electron beam writing apparatus 200, controls operations of components inside the electron optical column 10 and the precision stage 21 inside the writing chamber 20, respectively, so as to write a latent image with a predetermined pattern on the sample S by the electron beam. In order to control the operations, the calculation and control device 30 includes a main storage device 31, a shot data generation processing device 32, a sample position calculation device 33, a stage control device 34, a beam control device 35, a deflection control device 36, and a main control device 37.

A main storage device 31 can be configured to include, for example, a hard disk or a semiconductor storage element. The main storage device 31 stores a computer program such as basic software that manages and controls an operation of the calculation and control device 30, design data of a fine pattern (in the following description and FIG. 1, briefly referred to as "pattern design data") which can be formed in a relevant member to be patterned by transferring a latent image written on the sample S by the electron beam onto the member to be patterned, information on a size of a frame region that is a writing region determined to have the maximum deflection width of the electron beam by the main objective deflector 18, identification information and position information of a plurality of frame regions which can be virtually set in the sample S, information on a size of a sub field that is a writing region determined to have the maximum deflection width of the electron beam by the sub objective deflector 17, and identification information and position information of a plurality of sub fields which can be virtually set in each of the frame regions. Also, the main storage device 31 stores information on an allocation rule in the case of performing figure allocation, information on a division rule in the case of performing shot division, information on the shape and a size of a shot that is a basic unit of shot division, information on a current density of the electron beam, and information on an irradiation time of the electron beam.

Moreover, the main storage device 31 stores information that makes it possible to correct only a shot size of the electron beam for every shot, for example, a gain and offset correction table that makes it possible to correct a gain and offset of a driving voltage applied to the shaping deflector 15 for every shot, and information on an extraction condition of a shot which is to be corrected using corresponding information. In addition, the main storage device 31 stores information that makes it possible to correct a shot size and a shot irradiation position of the electron beam for every shot, for example, respective correction tables for the shot size and the shot irradiation position of the electron beam (in the following description and FIG. 1, are simply referred to as a "shot size and position correction table").

The shot data generation processing device 32 reads various types of data and information which are stored in the main storage device 31, calculates a beam current density, a beam irradiation time, a shot size, a shot irradiation position, or the like for every shot, which are required to write a latent image on the sample S, and generates shot data. The shot data generation processing device 32 operates under the control of a main control device 37.

A sample position calculation device 33 calculates a deviation amount and a deviation direction between the alignment portion previously set in the sample S and the alignment reference position in the electron beam writing apparatus 100 by using data of the optical image of the sample S which is acquired by the image acquiring device 22 inside the writing chamber 20. Also, by using two-dimensional direction variation amounts of the precision stage 21, that is, an X-axis direction variation amount and a Y-axis direction variation amount, using a measurement result from the laser length measuring device 23 in the case where the alignment portion is aligned with the alignment reference position, and two-dimensional direction variation amounts of the precision stage 21 which are sequentially measured by the laser length measuring device 23 after the alignment portion is aligned with the alignment reference position, a relative position of the sample S inside the writing chamber 20 is calculated.

The stage control device 34 operates under the control of the main control device 37 and drives the precision stage 21 such that the deviation amount calculated by the sample position calculation device 33 becomes 0 (zero) when the deviation amount is not 0 (zero). Also, the stage control device 34 operates under the control of the main control device 37 and continuously drives the precision stage 21 in a predetermined direction during a period from start of writing a latent image on the resist layer constituting the sample S to completion of writing the latent image.

The beam control device 35, being operated under the control of the main control device 37, controls an operation of the electron gun 11 and separately adjusts driving voltages which are respectively applied to the focusing lens 12, the projection lens 14, and the objective lens 16. Moreover, the beam control device 35 controls an operation of a height detecting device 24. It is possible to control a current density of the electron beam by adjusting the driving voltage of the focusing lens 12. It is also possible to control a size of an image of the opening portion OP1 of the first shaping aperture A1, which is projected onto the second shaping aperture A2, by adjusting the driving voltage of the projection lens 14. It is further possible to performing a focusing operation to focus the objective lens 16 at a height position of an upper surface of the sample S, which has been detected by the height detecting device 24, by adjusting the driving voltage of the objective lens 16. The main control device 37 controls an operation of the beam control device 35 according to shot data generated by the shot data generation processing device 32.

The deflection control device 36 is configured to include a plurality of amplifiers (not illustrated). The deflection control device 36 operates under the control of the main control device 37, and separately adjusts driving voltages of the blanking deflector 13, the shaping deflector 15, the sub objective deflector 17, and the main objective deflector 18. Formation of a shot of the electron beam can be controlled by adjusting the driving voltage of the blanking deflector 13, and as a result, it is possible to control irradiation or non-irradiation of the shot onto the sample S as well as to control an irradiation time of one shot. It is also possible to adjust a cross-sectional shape and a cross-sectional size of the electron beam by adjusting the driving voltage of the shaping deflector 15. It is further possible to control an irradiation position of the shot in a sub field by adjusting the driving voltage of the sub objective deflector 17. Also, it is possible to control the irradiation position of the shot for every sub field by adjusting the driving voltage of the main objective deflector 18. The main control device 37 controls an operation of the deflection control device 36 according to the shot data generated by the shot data generation processing device 32.

An auxiliary storage device 40 constituting the electron beam writing apparatus 100 can be configured by a driving device that reads information from a removable storage medium, such as an optical disk or a semiconductor memory, and writes the information in the removable storage medium. An operation of the auxiliary storage device 40 is controlled by the main control device 37. The information read from the removal storage medium by the auxiliary storage device 40 is stored in the main storage device 31 under the control of the main control device 37.

An input device 50 can be configured by, for example, a keyboard, a touch panel, an operation panel, or the like. Information or a command input from the input device 50 is transferred to the main control device 37, and the main control device 37 performs predetermined processing or control.

A display device 60 can be configured by a flat panel display, such as a liquid crystal display panel. The display device 60 operates under the control of the main control device 37, and functions as a device for displaying an input screen for information or a command, an information screen notifying information on, for example, the start of writing or the completion of writing, or the like.

In the electron beam writing apparatus 100 including the aforementioned components, the main control device 37 separately controls the stage control device 34, the beam control device 35, and the deflection control device 36 according to the shot data generated by the shot data generation processing device 32. In addition, the stage control device 34, the beam control device 35, and the deflection control device 36 respectively control operations of predetermined components so as to sequentially irradiate the electron beam onto the sample S by one shot at a time, thereby writing a latent image having a predetermined shape on the resist layer of the sample S.

The writing of the latent image by the electron beam writing apparatus 100 is performed by a writing method according to a second embodiment of the present invention. In the writing method according to the second embodiment of the present invention, the shot data is generated by using a shot correcting method according to a third embodiment of the present invention. The latent image writing method according to the electron beam writing apparatus 100 will be described referring to FIG. 2 and FIG. 3 below.

Figure 2:
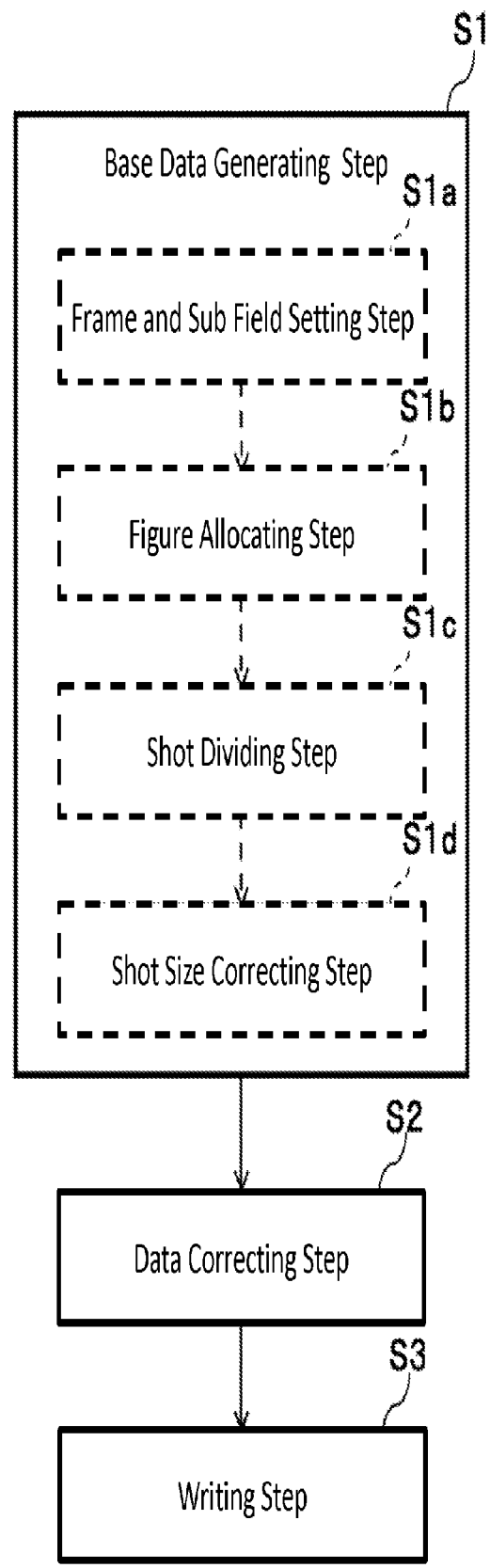
FIG. 2 is a flow chart illustrating the order of the steps when a latent image is written in a sample by a writing method using a charged particle beam according to the second embodiment of the present invention.

FIG. 2 is a flow chart illustrating the order of the steps when the latent image of the sample S is written by the writing method according to the second embodiment of the present invention. As illustrated in FIG. 2, the writing method according to the second embodiment of the present invention sequentially performs a base data generating step S1, a data correcting step S2, and a writing step S3 in the order thereof. The base data generating step S1 and the data correcting step S2 of the steps S1 to S3 are performed in the case of correcting a shot according to the shot correcting method of the third embodiment of the present invention. The electron beam writing apparatus 100 illustrated in FIG. 1 writes a latent image on the resist layer of the sample S by sequentially performing the base data generating step S1, the data correcting step S2 and the writing step S3. The operation of the electron beam writing apparatus 100 will be described in order of S1 to S3 referring to FIG. 1 below.

Base Data Generating Step

In the base data generating step S1 which is initially performed when a latent image is to be written, the base data serving as a base of shot data used in the case of writing the latent image is generated by the shot data generation processing device 32 by using the pattern design data stored in the main storage device 31. As illustrated in FIG. 2, the base data generating step S1 includes a frame and sub field setting step S1a, a figure allocating step S1b, a shot dividing step S1c, and a shot size correcting step S1d. It is noted that the shot size correcting step S1d may not necessarily be included.

In the frame and sub field setting step S1a, first, the shot data generation processing device 32 virtually sets a plurality of frame regions in the resist layer R of the sample S by using the pattern design data stored in the main storage device 31, information on respective sizes of the plurality of frame regions to be virtually set in the sample S, and identification information and position information of the plurality of frame regions. Next, the shot data generation processing device 32 virtually sets a plurality of sub fields in each of the frame regions F1 to F4 by using the information on sizes of the sub fields stored in the main storage device 31, and identification information and position information of the plurality of sub fields to be virtually set in each of the frame regions. When virtual setting of the sub fields is completed, the figure allocating step is performed.

In the figure allocating step S1b, the shot data generation processing device 32 allocates a figure having a predetermined shape to each of the sub fields by using the pattern design data stored in the main storage device 31 and information on an allocation rule in the case of performing figure allocation. When the figure allocation is completed, the shot dividing step S1c is performed.

In the shot dividing step S1c, the shot data generation processing device 32 divides each figure into a predetermined number of shots by using information on a division rule in the case of performing shot division, which is stored in the main storage device 31, and information on a shape and a size of a shot, which is a basic unit for shot division.

Figure 3:
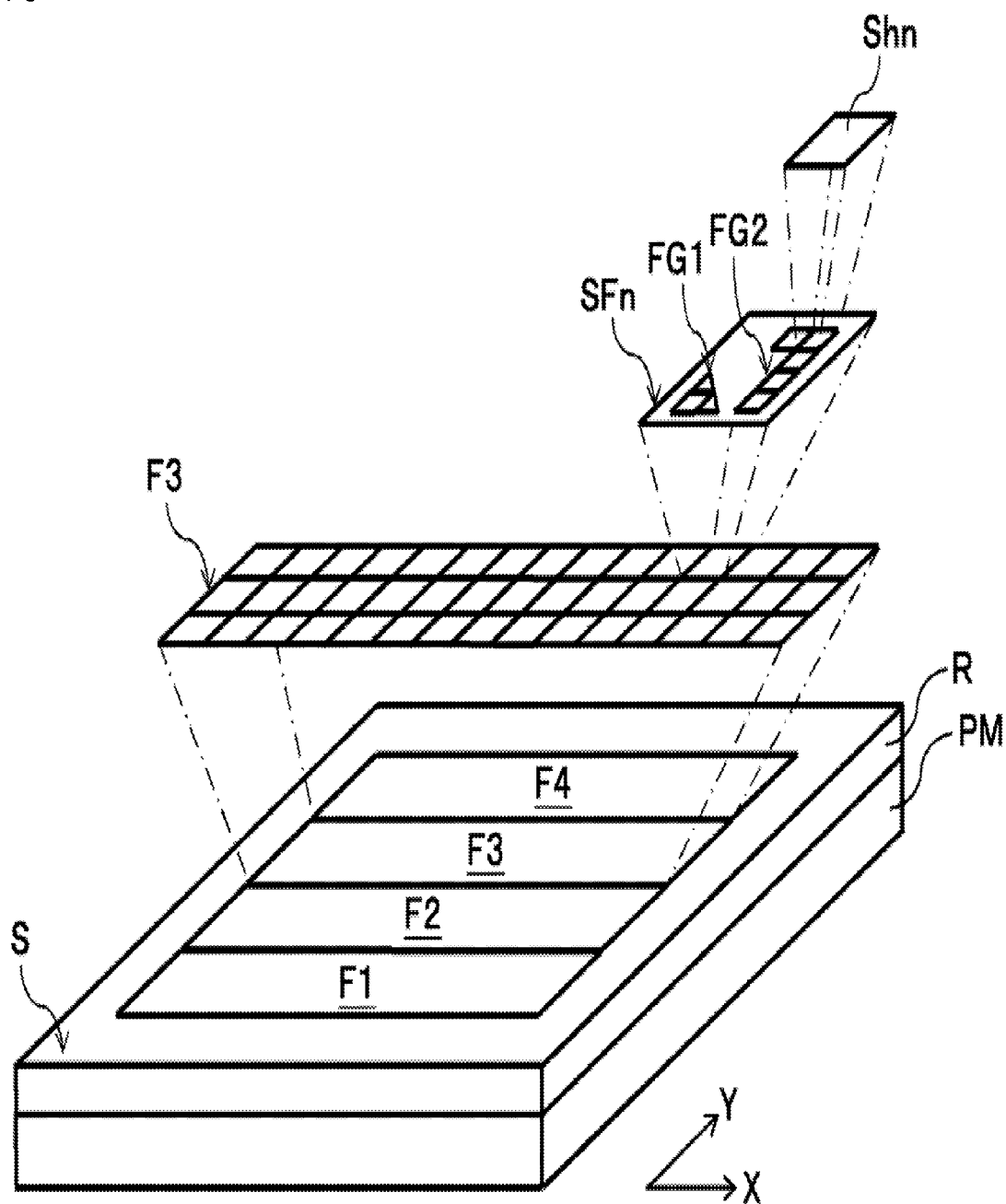
FIG. 3 is a schematic view illustrating one example of the order of the frame and sub field setting step to the shot dividing step as illustrated in FIG. 2.

FIG. 3 is a schematic view illustrating one example of the order of the frame and sub field setting step S1a to the shot dividing step S1c. As shown in FIG. 3, the sample S includes the resist layer R and 1 the light shielding film (the member to be patterned) PM which is an under layer of the resist layer R. Further, four frame regions F1 to F4 are hypothetically set in the resist layer R. Each of the frame regions F1 to F4 has a rectangular shape having long sides parallel to the X-axis of the precision stage 21 in a planar view, and the frame regions F1 to F4 are arranged in the Y-axis of the precision stage 21. A width in the Y-axis direction of each of the frame regions F1 to F4 is identical to a deflectable width in the Y-axis direction of the main objective deflector 18. A width in the X-axis direction of each of the frame regions F1 to F4 is wider than a deflectable width in the Y-axis direction of the main objective deflector 18.

Also, 45 sub fields SF are virtually set in each of the frame regions F1 to F4. Each of the sub fields SF has a rectangular shape in a planar view. In FIG. 3, a total of only 45 sub fields which are virtually set in the frame region F3 are illustrated, and only one sub field of the 45 sub fields is denoted by a reference symbol "SFn". A figure FG1 having a triangular shape and a figure FG2 having an L shape are allocated to the sub field SFn. The figure FG1 is divided into two shots each having a triangular shape and one shot having a rectangular shape. The figure FG2 is divided into five shots each having a rectangular shape. In FIG. 3, only one shot of a total of eight shots to be irradiated onto the sub field SFn is denoted by a reference symbol "Shn". When the shot division is completed, the shot size correcting step S1d is performed. As described above, it is noted that the shot size correcting step S1d may not necessarily be included.

In the shot size correcting step S1d, the shot data generation processing device 32 extracts a shot of which only the shot size is to be corrected and corrects data of a size of the shot, by using one of two pieces of correction information stored in the main storage device 31, that is, information which makes it possible to correct only the shot size of the electron beam for every shot, more specifically, a gain and offset correction table, and information on an extraction condition of a shot to be corrected by relevant information. By performing the frame and sub field setting step S1a, the figure allocating step S1b, the shot dividing step S1c and, if required, the shot size correcting step S1d, the base data, on which the shot data is based, used when a latent image is written on the resist layer R of the sample S can be obtained.

Data Correcting Step

In the data correcting step, the shot data generation processing device 32 corrects a size and an irradiation position with respect to predetermined shot data of the base data obtained in the base data generating step, for example, data of a predetermined edge shot, by using the other one of the two pieces of correction information stored in the main storage device 31, that is, information which makes it possible to correct each of the shot size and the shot irradiation position for every shot, more specifically, the shot size and position correction table. By performing the above correction, the shot data can be obtained. The shot data generation processing device 32 sequentially generates shot data for every sub field and stores the shot data in the main storage device 31. The details of "information which makes it possible to correct each of the shot size and the shot irradiation position for every shot" will be described referring to FIG. 4 to FIG. 6 below.

Writing Step

In the writing step, the main control device 37 separately controls the stage control device 34, the beam control device 35, and the deflection control device 36 according to the shot data generated by the shot data generation processing device 32, thereby writing a latent image having a predetermined shape on the resist layer of the sample S. The writing step using the electron beam writing apparatus 100 will be described using an example wherein the latent image is written in the resist layer R of the sample S as illustrated in FIG. 3 below.

In order to write a latent image on the resist layer R of the sample S, first, the sample S is mounted on the precision stage 21. The mounting of the sample S on the precision stage 21 can be performed by, for example, an autoloader (not illustrated in FIG. 1). Next, the sample position calculation device 33 calculates a relative position of the sample S by using a measurement result from the laser length measuring device 23 and information on the alignment reference position in the electron beam writing apparatus 100. Then, the stage control device 34 controls an operation of the precision stage 21 and aligns the alignment portion set in the sample S with the alignment reference position, by using information on the deviation amount and the deviation direction generated by the sample position calculation device 33 based on the optical image data of the sample S which has been acquired by the image acquiring device 22, that is, information on the deviation amount and the deviation direction between the alignment portion set in the sample S and the alignment reference position in the electron beam writing apparatus 100.

Also, the deflection control device 36 controls a value of a voltage to be applied to the objective lens 16 and focuses the objective lens 16 at the height position of the upper surface of the sample S, which has been detected by the height detecting device 24. In addition, the shot data generation processing device 32 sequentially starts generating shot data for every sub field.

Thereafter, the main control device 37 performs a predetermined control on the stage control device 34, the beam control device 35, and the deflection control device 36 according to the shot data generated by the shot data generation processing device 32 so as to write a latent image in each of frame regions F1 to F4. The stage control device 34 continuously drives the precision stage 21 by using information on a position of the sample S which is sequentially calculated by the sample position calculation device 33 and information on a start of writing reference position in each frame region, in a period from the time when writing of a latent image starts in a frame region where a latent image is to be initially written, for example, in the frame region F1 to the time when writing of the latent image is completed in a frame region where a latent image is to be finally written, for example, in the frame region F4.

For example, in a case where a latent image is sequentially written in the positive direction of the X-axis in each of the frame regions F1 to F4, the precision stage 21 is continuously driven in the negative direction of the X-axis under the control of the stage control device 34, such that an optical axis of the electron optical system EOS passes through a predetermined portion, for example, a geometrical center in the frame region F1. After writing of a latent image in the frame region F1 is finished, the precision stage 21 is driven in the positive direction of the X-axis and the negative direction of the Y-axis under the control of the stage control device 34, and is continuously driven in the negative direction of the X-axis such that the optical axis of the electron optical system EOS passes through a predetermined portion, for example, a geometrical center in the frame region F2. Thereafter, the precision stage 21 is similarly driven, and a latent image is written in the frame regions F3 and F4. In addition, it is possible to continuously drive the precision stage 21 so as to sequentially write a latent image in the positive direction of the X-axis in the frame regions F1 and F3, and sequentially write a latent image in the negative direction of the X-axis in the frame regions F2 and F4.

During writing of a latent image in the resist layer R, the blanking deflector 13 appropriately controls a trajectory of an electron beam so as to be a trajectory along which an electron beam passes through the opening portion OP1 of the first shaping aperture A1 and a trajectory along which an electron beam is incident to only a non-opening portion, such that an irradiation time and an irradiation timing of one shot are a predetermined time and a predetermined timing, under the control of the beam control device 35. Also, the projection lens 14 projects, on the second shaping aperture A2, an image of the opening portion OP1, which is formed by the electron beam passing through the opening portion OP1 of the first shaping aperture A1. Also, the shaping deflector 15 adjusts a projection position of an image of the opening portion OP1 projected on the second shaping aperture A2 and controls a cross-sectional size and a cross-sectional shape of the electron beam, under the control of the deflection control device 36.

In addition, with respect to each of sub fields included in a deflectable area of the main objective deflector 18, that is, a rectangular area which is defined by an X-axis deflectable width and a Y-axis deflectable width of the main objective deflector 18, in response to driving of the precision stage 21 in the negative direction or the positive direction of the X-axis, the main objective deflector 18 deflects the electron beam sequentially according to a predetermined sequence and at predetermined time intervals toward a reference position, which is previously set in each of the sub fields, under the control of the beam control device 35. Also, the sub objective deflector 17 deflects the electron beam, which is deflected toward the reference position of the sub field in a predetermined direction under the control of the beam control device 35, and irradiates the electron beam onto respective shot division portions in the sub field. That is, shot is irradiated onto the respective shot division portions in the sub field. Writing of a latent image is completed by irradiating a predetermined shot onto all of the shot division portions of the sample S, a writing step being completed.

In this case, information that makes it possible to correct, for every shot, each of a shot size and a shot irradiation position which are used in the aforementioned data correction step, specifically, a shot size and position correction table can be generated by writing a plurality of test patterns, more specifically, multiple test patterns on the resist layer of a test sample having a layer configuration corresponding to the sample S, by a charged particle beam, forming multiple dimension measurement patterns by transferring the multiple test patterns onto a member to be patterned of the test sample, and using in-plane distribution data of an XY dimension variation amount obtained by actually measuring an XY dimension difference occurring in the dimension measurement patterns. The acquisition of in-plane distribution data of an XY dimension variation amount will be described referring to FIG. 4 and FIG. 5, and then the method for generating a shot size and shot position correction table will be described referring to FIG. 6 below.

In the case of obtaining the in-plane distribution data of the XY dimension variation amount, first, there is prepared a test sample having a layer configuration corresponding to the sample S, that is, a test sample including a resist layer having the same material, the same thickness, and the same size as those of the resist layer of the sample S as well as a member to be patterned having the same material, the same thickness, and the same size as those of the member to be patterned of the sample S.

Next, a plurality of test patterns, more specifically, multiple test patterns are written on the resist layer of the test sample, each of the test patterns having a first sub test pattern made of a latent image having a rectangular planar shape and a second sub test pattern made of a latent image having a shape and a size obtained by rotating the first sub test pattern by 90 degrees on a plane. Thereafter, a plurality of dimension measurement patterns each having a first actual pattern corresponding to the first sub test pattern and a second actual pattern corresponding to the second sub test pattern are formed in the member to be patterned of the test sample by transferring the multiple test patterns onto the member to be patterned of the test sample. In this case, development conditions of the resist layer and etching conditions in the case of performing patterning on the member to be patterned through an etching mask obtained by developing the resist layer are substantially identical to development conditions and etching conditions in the case of forming a fine pattern in the member to be patterned PM (see FIG. 3) of the sample S.

Thereafter, one side of the first actual pattern is set as a reference side, and a dimension difference between the reference side of the first actual pattern and a side of the second actual pattern, corresponding to the reference side, is actually measured, with respect to each of the multiple dimension measurement patterns formed in the member to be patterned of the test pattern. In addition, the in-plane distribution data (map data) of the XY dimension variation amount is generated by using the dimension difference for each of the dimension measurement patterns.

Figure 4:
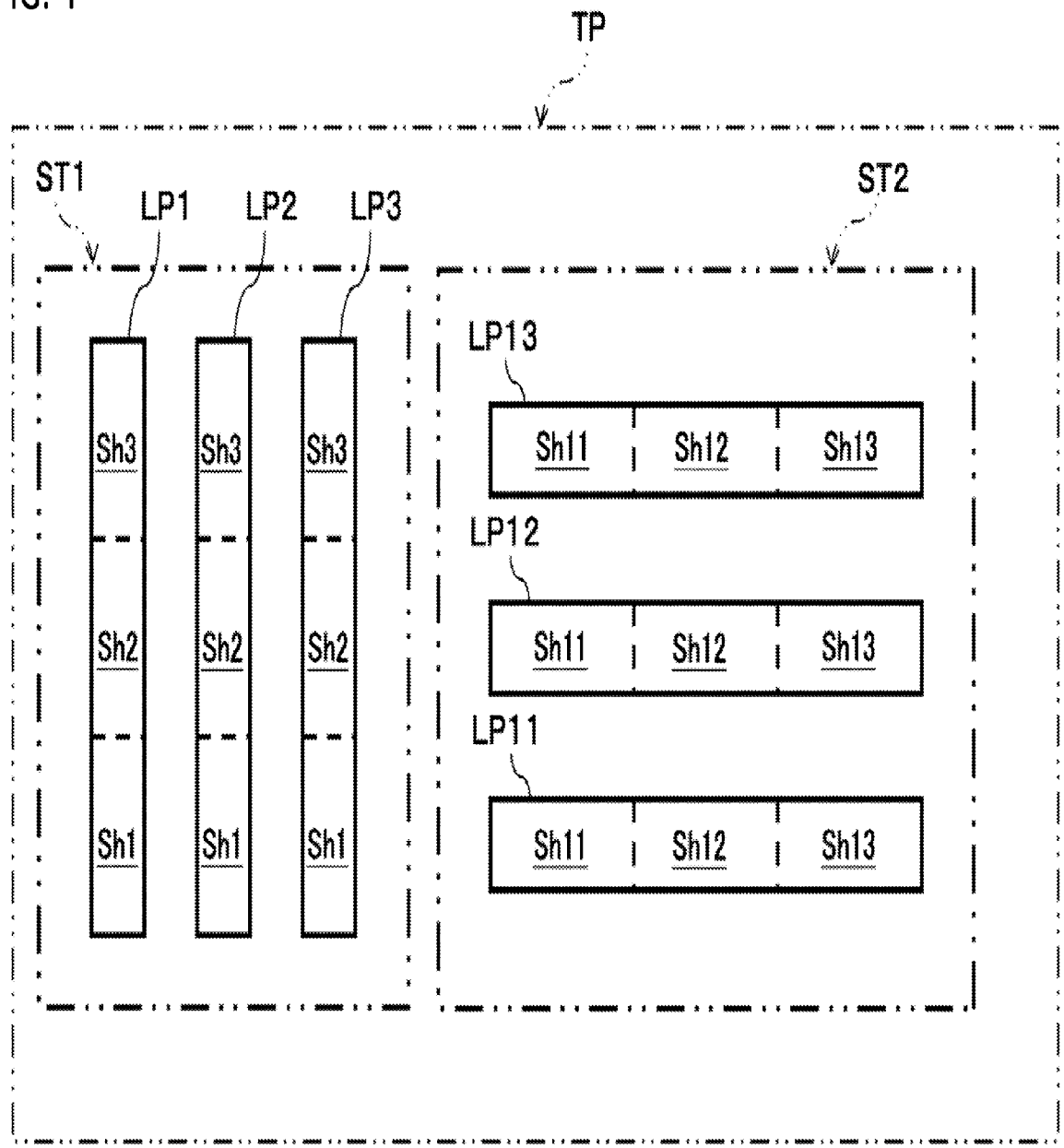
FIG. 4 is a plan view illustrating an example of a test pattern which can be used when in-plane distribution data of the XY dimension variation amount is obtained, wherein the in-plane distribution data of the XY dimension variation amount is used during a generation of a shot size and position correction table, that is used by the electron beam apparatus illustrated in FIG. 1.

FIG. 4 is a plan view illustrating an example of a test pattern which can be used when the in-plane distribution data of the XY dimension variation amount is obtained. The first sub test pattern ST1 is a pattern formed by arranging three rectangular patterns LP1 to LP3, which are congruent with one another, at equal intervals along an X-axis direction of the precision stage 21 illustrated in FIG. 1. The second sub test pattern ST2 is a pattern formed by arranging three rectangular patterns LP11 to LP13, which are congruent with the rectangular patterns LP1 to LP3, at equal intervals along a Y-axis direction of the precision stage 21 illustrated in FIG. 1.

Each of the rectangular patterns LP1 to LP3 constituting the first sub test pattern ST1 has short sides along the X-axis direction of the precision stage 21 illustrated in FIG. 1 and long sides along the Y-axis direction of the precision stage 21. Each of the rectangular patterns LP1 to LP3 is written by irradiating three shots Sh1 to Sh3 having planar shapes which are congruent with one another. Also, each of the rectangular patterns LP11 to LP13 constituting the second sub test pattern ST2 has long sides along the X-axis direction of the precision stage 21 illustrated in FIG. 2 and short sides along the Y-axis direction of the precision stage 21. Each of the rectangular patterns LP11 to LP13 is written by irradiating three shots Sh11 to Sh13 having planar shapes which are congruent with one another. In the case of writing the sub test patterns ST1 and ST2 on the test sample, if required, the shot size may be corrected by adjusting a value of a voltage to be applied to the shaping deflector 15 (see FIG. 1) using a gain and offset correction table or the like.

In the case of forming the dimension measurement patterns in the member to be patterned by writing the test pattern TP on the resist layer of the test sample and transferring the test pattern TP onto the member to be patterned of the test sample, the XY dimension difference in the dimension measurement pattern is obtained by actually measuring a length L1 of the short sides of the first actual pattern corresponding to any one of the three rectangular patterns LP1 to LP3 constituting the first sub test pattern ST1 and a length L2 of the short sides of the second actual pattern corresponding to any one of the three rectangular patterns LP11 to LP13 constituting the second sub test pattern ST2, and by calculating a difference between the lengths (L1−L2).

Alternatively, the XY dimension difference in the dimension measurement pattern is obtained by calculating a mean value M1 of actually-measured values of lengths of respective short sides of a total of three first actual patterns corresponding to the three rectangular patterns LP1 to LP3 constituting the first sub test pattern ST1 and a mean value M2 of actually-measured values of lengths of respective short sides of a total of three second actual patterns corresponding to the three rectangular patterns LP11 to LP13 constituting the second sub test pattern ST2, and by calculating a difference between the mean values (M1−M2).

The in-plane distribution data of the XY dimension variation amount is obtained by generating the map data from the XY dimension differences for the respective dimension measurement patterns.

Figure 5:
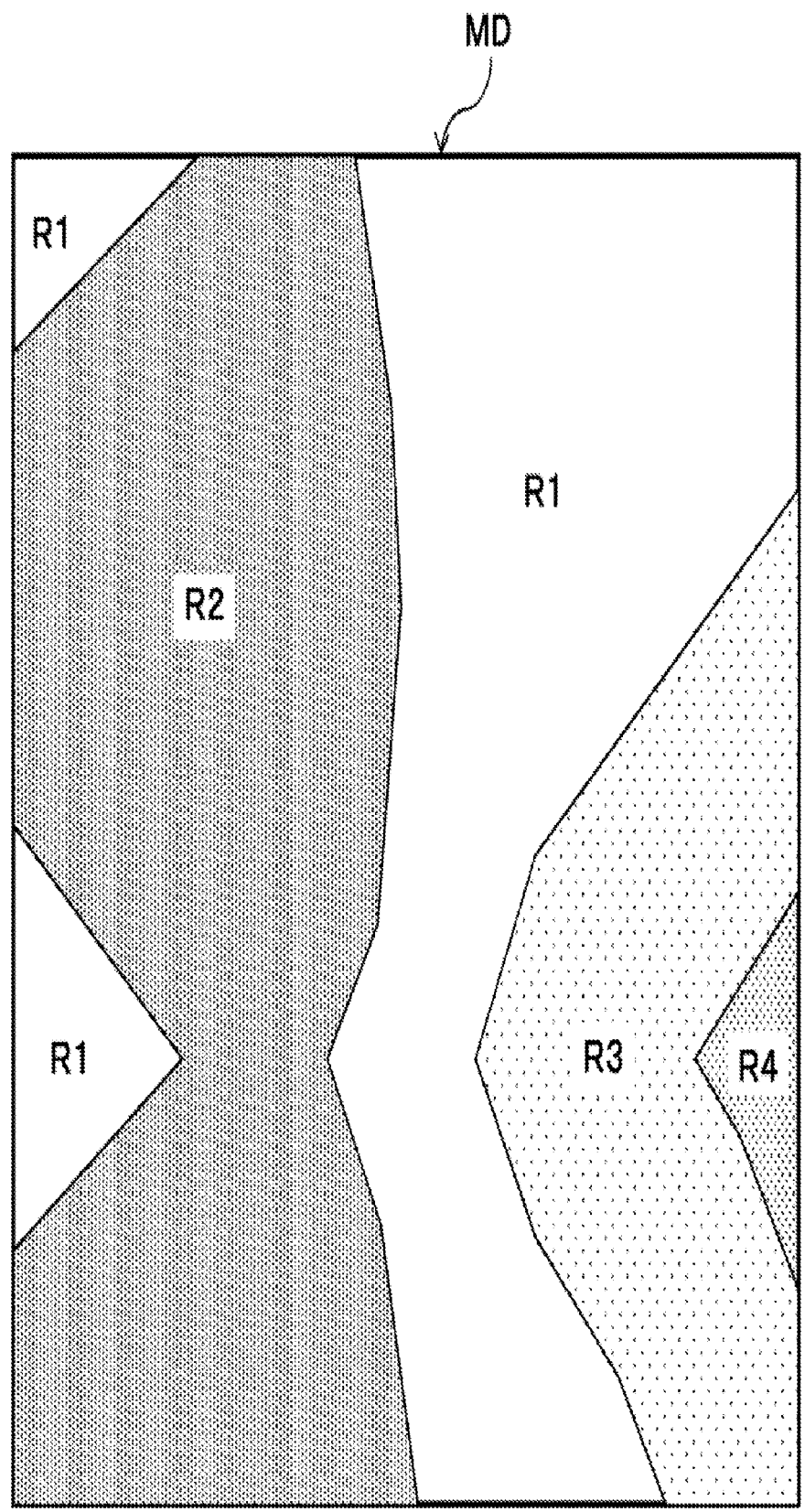
FIG. 5 is a schematic view illustrating one example of the in-plane distribution data of the XY dimension variation amount used during a generation of a shot size and position correction table, that is used by the electron beam apparatus illustrated in FIG. 1.

FIG. 5 is a schematic view illustrating an example of the in-plane distribution data of the XY dimension variation amount. In the writing, there is illustrated the map data MD generated from the XY dimension differences (M1−M2) for the respective dimension measurement patterns, in which the multiple dimension measurement patterns are formed by performing dry etching on the member to be patterned (the light shielding film) through the etching mask after the multiple test patterns TP illustrated in FIG. 4 are written by the electron beam on the resist layer of the test sample corresponding to a mask blank in which the resist layer is formed, and the etching mask is obtained by developing the resist layer.

In the example illustrated in FIG. 5, on the plane of the test sample after formation of the dimension measurement patterns, there are provided a region R1 in which a value of the XY dimension difference (M1−M2) is 0 (zero), a region R2 in which the value of the XY dimension difference (M1−M2) is a predetermined positive value, and regions R3 and R4 in which the value of the XY dimension difference (M1−M2) is a predetermined negative value. An absolute value of the XY dimension difference in the region R4 is larger than an absolute value of the XY dimension difference in the region R3.

The in-plane distribution of the XY dimension variation amount is changed depending on a material of the resist layer on which a latent image is written by the electron beam or a material of the member to be patterned which is an underlayer of the resist layer. Also, when the materials of the resist layer and the member to be patterned are respectively fixed, the in-plane distribution of the XY dimension variation amount is changed according to development conditions in the case of developing a latent image or patterning conditions in the case of performing patterning on the member to be patterned. In addition, the in-plane distribution of the XY dimension variation amount is changed depending on the shot size at the time of writing the test pattern.

Therefore, it is preferable that a various types of in-plane distribution data of the XY dimension variation amount are obtained by performing an acquisition of the in-plane distribution data of the XY dimension variation amount a plurality of times while changing at least one of the parameters, the parameters including: a material of the resist layer on which a latent image is written by the electron beam; a material of the member to be patterned, such as a light shielding film, which is an underlayer of the resist layer; a development condition in the case of developing a latent image written on the resist layer; a patterning condition of the member to be patterned; and the shot size in the case of writing the test pattern. In addition, it is preferable that a shot size and position correction table is generated for each of the various types of in-plane distribution data of the XY dimension variation amount as obtained as described above, and is stored in the main storage device 31 illustrated in FIG. 1. It is possible to enhance versatility of the electron beam writing apparatus 100 by including a various types of shot size and position correction tables.

Next, the method of generating the shot size and position correction table will be described. In the case of generating the shot size and position correction table, at first, edge shots which need to correct the shot size and the shot irradiation position are extracted for every sub field or for every predetermined number of sub fields adjacent to one another, by using the aforementioned base data and the in-plane distribution data of the XY dimension variation amount, the predetermined number being equal to or larger than 2. The extracted edge shot can be determined to be, for example, only an edge shot having a rectangular shape.

Next, respective correction amounts for the shot size and the shot irradiation position of the edge shot are calculated by using the in-plane distribution data of the XY dimension variation amount. Specifically, the respective correction amounts for the shot size and the shot irradiation position of the extracted edge shot are set so as to get closer to a state in which regions where the aforementioned XY dimension difference (L1−L2) or (M1−M2) is 0 (zero) or substantially 0 (zero) are uniformly distributed in a plane. Setting of the correction amounts can be performed by using a computer.

For example, in the case of writing a latent image on a region of the sample corresponding to a region where the XY dimension difference (L1−L2) is larger than 0 (zero), the respective correction amounts for the shot size and the shot irradiation position are set such that a value of L1 decreases and the XY dimension difference (L1−L2) is 0 (zero) or substantially 0 (zero), for example, such that the value of the dimension L1 decreases by a predetermined amount in the positive direction or the negative direction of the X-axis. In the case of writing a latent image on a region of the sample corresponding to a region where the XY dimension difference (L1−L2) is smaller than 0 (zero), the respective correction amounts for the shot size and the irradiation shot position are set such that a value of L1 increases and the XY dimension difference (L1−L2) is 0 (zero) or substantially 0 (zero), for example, such that the value of the dimension L1 increases by a predetermined amount in the positive direction or the negative direction of the X-axis.

Thereafter, for each extracted edge shot, identification information and position information before correction of the edge shot, information on the correction amount of the shot size, and information on the correction amount of the shot irradiation position are stored as a set, for example, in a group of a sub field, in a desired storage medium.

The edge shot refers to a shot to write a final outline of a latent image. However, in the case of generating the shot size and position correction table, a shot which does not write a final outline of a latent image, but writes the outline of the latent image in an intermediate stage may be extracted as an edge shot.

Figure 6:
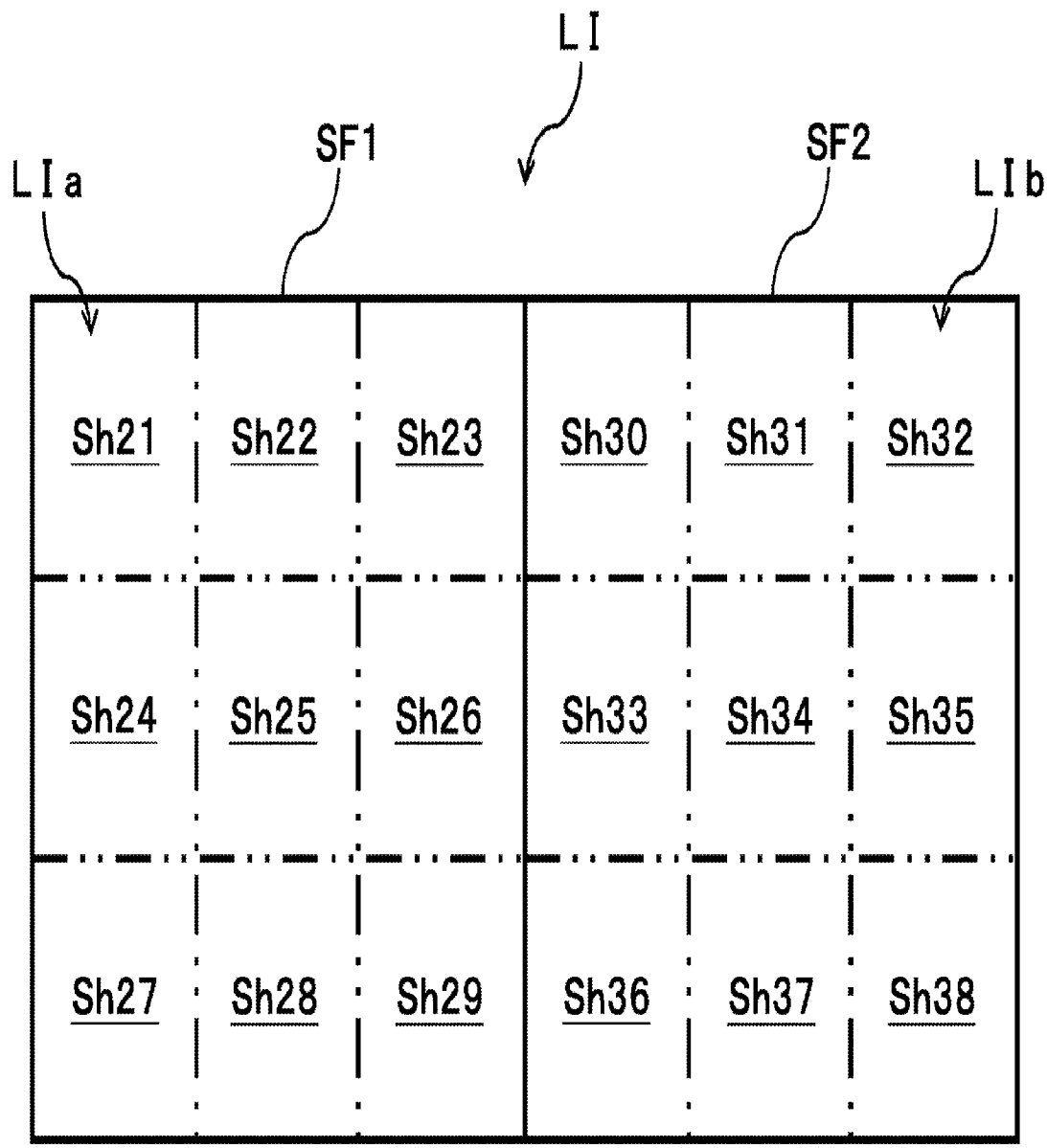
FIG. 6 is a plan view schematically illustrating one example of the latent image which is written by an edge shot and a non-edge shot.

For example, in the case of writing a latent image L1 illustrated in FIG. 6, in pattern design data input to the main storage device 31, two independent figures indicated by L1a and L1b are input, and in the shot data generation processing device 32, division to nine shots of Sh21 to Sh29 and division to nine shots of Sh30 to Sh38 are respectively performed. Actually, as illustrated in FIG. 6, figure L1a and figure L1b are adjacent to each other, and 18 shots of Sh21 to Sh38 form one figure indicated by L1. In this case, 16 shots of Sh21 to Sh24, Sh26 to Sh33, and Sh35 to Sh38 are extracted from the pattern design data as edge shots, but in a stage after writing of the latent image L1, two shots of Sh26 and Sh33 become non-edge shots.

In this case, although the shot Sh26 is determined as an edge shot, and the shot size and the shot irradiation position are corrected, the shot Sh26 is surrounded by eight shots of Sh22, Sh23, Sh25, Sh28, Sh29, Sh30, Sh33, and Sh36. Therefore, it is possible to substantially ignore influence on dimension variation of a fine pattern finally formed in the member to be patterned. Also, even in a case where the shot size and the shot irradiation position are corrected in right and left directions in FIG. 6, with respect to the shots Sh23, Sh29, Sh30, and Sh36 extracted as edge shots when the edge shots are extracted from the pattern design data, other shots are adjacent to the shots Sh23, Sh29, Sh30, and Sh36 in right and left directions of the shots Sh23, Sh29, Sh30, and Sh36. Therefore, it is possible to substantially ignore influence on dimension variation of a fine pattern finally formed in the member to be patterned.

In the case of figure allocation or shot division, figure adjacency information, indicating that a figure is adjacent to another figure at a predetermined location, is set as a predetermined figure or shot adjacency information, indicating that a shot is adjacent to another shot at a predetermined side, is set as a predetermined shot. When extraction of an edge shot is performed by using the above information and the aforementioned pattern design data, it is possible to prevent extraction of a shot which does not write a final outline of a latent image, but in an intermediate stage, writes the outline of the latent image as an edge shot. FIG. 6 is a plan view schematically illustrating an example of the latent image which is written by an edge shot and a non-edge shot.

The electron beam writing apparatus 100 illustrated in FIG. 1 corrects predetermined shot data of the base data and generates shot data by using the shot size and position correction table which can be generated as described above. Therefore, the dimension of the latent image is more easily adjusted, compared to the case of writing the latent image by respectively controlling the shot size and the shot irradiation position according to the base data without correcting the base data. Accordingly, it is easier to adjust an actual dimension of a fine pattern finally formed in the member to be patterned. This will be described below.

A variable shaped beam type writing apparatus which controls a shot size using the second shaping aperture can change a projection position of an image of the opening portion of the first shaping aperture, which is formed by the electron beam (shot) which has passed through the opening portion of the first shaping aperture, only in a direction perpendicular to one edge portion in a planar view, the one edge portion defining the opening portion and the non-opening portion of the second shaping aperture. That is, in the variable shaped beam type writing apparatus, one reference side exists in a shot and there is a limitation that control of a shot size can be performed only by magnifying or reducing the shot in a direction perpendicular to the reference side while the reference side is fixed.

Therefore, there occur many cases where it is difficult to realize intended correction to an actual dimension of the fine pattern finally formed in the member to be patterned merely by extracting an edge shot and correcting only a shot size of the edge shot. For example, there are many cases where an irradiation position of a shot overlaps that of an adjacent shot in the case of magnifying a shot size, or a gap occurs between the irradiation positions of the shot and the adjacent shot in the case of reducing the shot size, and therefore, a pattern having a desired dimension cannot be formed during a developing the resist layer.

For example, when respective positions of a left side and a lower side of the rectangular shot are fixed by the opening portion OP2 of the second shaping aperture A2, correction of a shot size of a shot having the rectangular shape is, in fact, realized by shifting a position of a right side or an upper side of the shot having the rectangular shape. In this case, in the case of correcting the latent image L1, for example, as in FIG. 6, correction to shift the left side of the shot is required for the shots Sh21, Sh24, and Sh27, and correction to shift the lower side of the shot is required for the shots Sh27 to Sh29 and Sh36 to Sh38. However, correction to shift the left or lower side of the shot cannot be performed merely by correction of the shot size of the shot having the rectangular shape.

In order to appropriately correct such a shot, it is necessary to correct both the shot size and the shot irradiation position defined in the base data. For example, there is a need to not only perform correction so as to shift the right side or the upper side of the shot or the both sides, but also perform shot position correction by the sub objective deflector such that a shot after the correction does not overlay a right or upper shot or a gap is not caused between the shot after the correction and the right or upper shot. Specifically, when, for example, six shots of Sh27 to Sh29 and Sh36 to Sh38 in FIG. 6 are to be downwardly expanded by 2 nm, correction is performed, through correction of the shot size of a shot having a rectangular shape, so as to upwardly expand the shapes of the six shots by 2 nm as well as to shift the positions of the six shots to locations lower than those calculated before correction of the shot size by 2 nm. In this way, it is possible to realize correction in which the six shots of Sh27 to Sh29 and Sh36 to Sh38 are maintained in a state of being respectively adjacent to six shots of Sh24 to Sh26 and Sh33 to Sh35 disposed at upper sides thereof, without overlaying the six shots of Sh24 to Sh26 and Sh33 to Sh35, and in which the sizes thereof seem as if they were merely downwardly expanded by 2 nm.

The electron beam writing apparatus 100 illustrated in FIG. 1 can correct both the shot size and the shot irradiation position defined in the base data by using the shot size and position correction table. Consequently, intended appropriate correction can be performed to the XY dimension difference of the fine pattern finally formed in the member to be patterned. Therefore, according to the electron beam writing apparatus 100, the dimension of the latent image is more easily adjusted, compared to the case of writing the latent image by respectively controlling the shot size and the shot irradiation position according to the base data without correcting the aforementioned base data. As a result, it is easy to adjust an actual dimension of the fine pattern which is finally formed on the member to be patterned.

Also, since the shot size and position correction table used in the electron beam writing apparatus 100 is generated from the in-plane distribution data of the aforementioned XY dimension variation amount, the electron beam writing apparatus 100 makes it possible to reduce the XY dimension variation amount in the fine pattern finally formed in the member to be patterned PM (see FIG. 3) constituting the sample S, over the entire surface of the member to be patterned PM. As a result, it is possible to suppress occurrence of dimension variation, which is not intended by a user of the electron beam writing apparatus 100, in the fine pattern finally formed in the member to be patterned PM.

As mentioned above, the charged particle beam writing apparatus, the writing method using the charged particle beam, and the shot correction method of the charged particle beam writing method are described, however the present invention is not limited to the above embodiments and may be modified in various forms without departing from the scope of the invention.

For example, the charged particle beam writing apparatus according to the present invention can be a variable-shaped ion beam writing apparatus, in addition to the variable-shaped electron beam writing apparatus. When the alignment portion previously set in the sample S is aligned with the alignment reference position in the charged particle beam writing apparatus, it is possible to apply a passive alignment method. In this case, for example, one or a plurality of side surfaces of the sample arc the alignment portions of the sample and, a locking portion having a desired shape which locks the alignment portion of the sample is fixedly disposed in the precision stage. The portion in which the locking portion locks the sample serves as the alignment reference position in the charged particle beam writing apparatus. The information that makes it possible to correct only the shot size of a charged particle beam for every shot, such as the gain and offset correction table, is not necessarily used in the case of generating the shot data. It may be possible to configure a device of generating the shot data without using the information.

The information that makes it possible to respectively correct the shot size and the shot irradiation position of a charged particle beam for every shot, such as the gain and offset correction table, is not limited to the information mentioned in the embodiments. For example, although a position correction amount by the main objective deflector is identical to a correction amount of the shot size in the present embodiment, independent values may be used. Also, it is possible to obtain the in-plane distribution data of the XY dimension variation amount by transferring a test pattern, other than the test pattern TP illustrated in FIG. 4, onto the member to be patterned of the test sample to form a dimension measurement pattern in the member to be patterned. In the case of writing a test pattern having a first sub test pattern and a second sub test pattern on the test sample, the first sub test pattern is only required to include at least one latent image having a rectangular planar shape, and the second sub test pattern is only required to include at least one latent image having a shape and a size obtained by rotating the rectangular latent image included in the first sub test pattern by 90 degrees on a plane.

Also, two pieces of map data can be coupled or combined to configure the in-plane distribution data of the XY dimension variation amount. In the case of configuring the in-plane distribution data of the XY dimension variation amount by the two pieces of map data which are first map data and second map data, the first map data can be obtained by, for example, writing a plurality of first test patterns each including at least one rectangular latent image on the resist layer of the test sample, transferring the first test patterns (latent images) onto the member to be patterned of the test sample to form a plurality of dimension measurement patterns in the member to be patterned, followed by actually measuring a difference between an actual dimension and a design dimension in a desired side when each of the dimension measurement patterns is viewed in a planar view. In addition, the second map data can be obtained by writing a plurality of second test patterns each including at least one latent image having a shape and a size obtained by rotating the rectangular latent image included in the first test pattern by 90 degrees on a plane, transferring the second test patterns (latent images) onto the member to be patterned of the test sample to form a plurality of dimension measurement patterns in the member to be patterned, followed by actually measuring a difference between an actual dimension and a design dimension in a desired side when each of the dimension measurement patterns is viewed in a planar view, that is, a side corresponding to a side in which actual measurement is performed when the first map data is obtained.

When the shot size and correction table is generated by using an in-plane distribution data of an XY dimension variation amount, which is configured by coupling or combining the first map data and the second map data as described above, it is possible to easily reduce the XY dimension variation amount in a fine pattern finally formed in the member to be patterned of the sample over the entire surface of the member to be patterned and to enhance dimension precision of the fine pattern finally formed in the member to be patterned of the sample.

The information that makes it possible to correct only a shot size of a charged particle beam for every shot, such as the gain and offset correction table, and the information that makes it possible to respectively correct a shot size and a shot irradiation position of the charged particle beam for every shot, such as the shot size and position correction table, can be handled as being separate information from each other, or can be handled together by collecting the two pieces of information, for example, in one table. The present invention is not limited to the above-mentioned embodiments and can be implemented in various ways, that is, the invention may be changed, improved, or combined without departing from the spirit of the invention

What is claimed is:

1. A charged particle beam writing apparatus comprising:
a charged particle optical system including a first deflection control system configured to form a shot of a charged particle beam by a blanking deflector and a first shaping aperture, a second deflection control system configured to control a shape and a size of the shot by a shaping deflector and a second shaping aperture, and a third deflection control system configured to control an irradiation position of the shot, of which the shape and the size are controlled, by at least one objective deflector;
a shot data generation processing device configured to generate shot data in a case of writing a latent image on a resist layer in a sample, by using
(1) design data of a pattern to be formed in a member, wherein the member to be patterned is formed in a sample, and the resist layer is formed on the member to be patterned, and (2) correction information of a shot size and an irradiation shot position which are obtained from an in-plane distribution data of an XY dimension variation amount of a plurality of dimension measurement patterns, wherein the plurality of dimension measurement patterns are formed by writing using the charged particle beam, a plurality of test patterns on a resist layer of a test sample having a layer configuration corresponding to the sample and, thereafter, transferring the plurality of test patterns onto a member to be patterned that is provided in the test sample; and a deflection control device configured to respectively control formation of the shot, the shape and the size of the shot, and the irradiation position of the shot, by adjusting respective driving voltages of the blanking deflector, the shaping deflector, and the at least one objective deflector according to the shot data, wherein the shot data generation processing device, when generating shot data in a case of writing a latent image on a resist layer in a sample, extracts an edge shot of the dimension measurement patterns and corrects both the shot size and the shot irradiation position corresponding to the edge shot by using the correction information of a shot size and an irradiation shot position.

2. The charged particle beam writing apparatus according to claim 1, wherein the in-plane distribution data of the XY dimension variation amount is data generated from dimension differences in a plurality of dimension measurement patterns, the plurality of dimension measurement patterns being generated by:

writing a plurality of test patterns on the resist layer of the test sample, each of the test patterns having a first sub test pattern made of a latent image having a rectangular planar shape and a second sub test pattern obtained by rotating the first sub test pattern by 90 degrees;

transferring the plurality of test patterns onto the member to be patterned that is provided in the test sample to form a plurality of dimension measurement patterns, each of the dimension measurement patterns having a first actual pattern corresponding to the first sub test pattern and a second actual pattern corresponding to the second sub test pattern; and measuring a dimension difference between a reference side of the first actual pattern and a side corresponding to the reference side in the second actual pattern with respect to each of the plurality of dimension measurement patterns in a state where one side of the first actual pattern is set as the reference side.

3. The charged particle beam writing apparatus according to claim 2, wherein the rectangular shape has a pair of long sides and a pair of short sides.

4. The charged particle beam writing apparatus according to claim 2, wherein the rectangular shape has a pair of long sides and a pair of short sides, and the reference side corresponds to one short side of the rectangular shape.

5. The charged particle beam writing apparatus according to claim 2, wherein the rectangular shape has a pair of long sides and a pair of short sides, and the reference side corresponds to one long side of the rectangular shape.

6. The charged particle beam writing apparatus according to claim 1, wherein the charged particle beam is an electron beam.

7. A writing method using a charged particle beam, comprising:

a base data generating step of generating base data which is a base of shot data used in a case of writing a latent image on a resist layer in a sample by a charged particle beam using design data of a pattern to be formed in a member that is provided in the sample, wherein the resist layer is formed on the member to be patterned;

a data correcting step of correcting the base data, by writing a plurality of test patterns on a resist layer in a test sample having a layer configuration corresponding to the sample by a charged particle beam, transferring the plurality of test patterns onto a member to be patterned that is provided in the test sample to form a plurality of dimension measurement patterns, measuring an XY dimension difference for each of the plurality of dimension measurement patterns to obtain in-plane distribution data of an XY dimension variation amount, and generating correction information of a shot size and an irradiation shot position using the in-plane distribution data of the XY dimension variation amount; and a writing step of writing a latent image corresponding to the pattern on the resist layer in the sample, by sequentially irradiating the charged particle beam on the resist layer in the sample shot by shot, according to the shot data obtained by correcting the base data in the data correcting step, wherein the data correcting step, when correcting the base data, extracts an edge shot of the dimension measurement patterns and corrects both the shot size and the shot irradiation position corresponding to the edge shot by using the correction information of a shot size and an irradiation shot position.

8. The writing method using a charged particle beam according to claim 7, wherein the in-plane distribution data of the XY dimension variation amount is data generated from dimension differences in a plurality of dimension measurement patterns, the plurality of dimension measurement patterns being generated by:

writing a plurality of test patterns on the resist layer of the test sample, each of the test patterns having a first sub test pattern made of a latent image having a rectangular planar shape and a second sub test pattern obtained by rotating the first sub test pattern by 90 degrees;

transferring the plurality of test patterns onto the member to be patterned that is provided in the test sample to form a plurality of dimension measurement patterns in the member to be patterned, each of the dimension measurement patterns having a first actual pattern corresponding to the first sub test pattern and a second actual pattern corresponding to the second sub test pattern; and measuring a dimension difference between a reference side of the first actual pattern and a side corresponding to the reference side in the second actual pattern with respect to each of the plurality of dimension measurement patterns in a state where one side of the first actual pattern is set as the reference side.

9. The writing method using a charged particle beam according to claim 8, wherein the rectangular shape has a pair of long sides and a pair of short sides.

10. The writing method using a charged particle beam according to claim 8, wherein the rectangular shape has a pair of long sides and a pair of short sides, and the reference side corresponds to one short side of the rectangular shape.

11. The writing method using a charged particle beam according to claim 8, wherein the rectangular shape has a pair of long sides and a pair of short sides, and the reference side corresponds to one long side of the rectangular shape.

12. The writing method using a charged particle beam according to claim 7, wherein the base data generating step includes a shot size correcting step of extracting a shot of which only a shot size is to be corrected, and correcting data of the shot size, using information which makes it possible to correct only the shot size of the charged particle beam for every shot and information on an extraction condition of a shot to be corrected by the information.

13. The writing method using a charged particle beam according to claim 7, wherein the charged particle beam is an electron beam.

14. A shot correction method of a charged particle beam writing method, comprising:
   a base data generating step of generating base data which is a base of shot data used in a case of writing a latent image on a resist layer in a sample by a charged particle beam using design data of a pattern formed in a member that is provided in the sample, wherein the resist layer is formed on the member to be patterned;
   a data correcting step of correcting the base data, by writing a plurality of test patterns on a resist layer in a test sample having a layer configuration corresponding to the sample by a charged particle beam, transferring the plurality of test patterns onto a member to be patterned in the test sample to form a plurality of dimension measurement patterns, measuring an XY dimension difference for each of the plurality of dimension measurement patterns to obtain in-plane distribution data of an XY dimension variation amount, and generating correction information of a shot size and an irradiation shot position using the in-plane distribution data of the XY dimension variation amount,
   wherein the data correcting step, when correcting the base data, extracts an edge shot of the dimension measurement patterns and corrects both the shot size and the shot irradiation position corresponding to the edge shot by using the correction information of a shot size and an irradiation shot position.

15. The shot correction method of a charged particle beam writing method according to claim 14, wherein the in-plane distribution data of the XY dimension variation amount is data generated from dimension differences in a plurality of dimension measurement patterns, the plurality of dimension measurement patterns being generated by:
   writing a plurality of test patterns on the resist layer of the test sample, each of the test patterns having a first sub test pattern made of a latent image having a rectangular planar shape and a second sub test pattern obtained by rotating the first sub test pattern by 90 degrees;
   transferring the plurality of test patterns onto the member to be patterned that is provided in the test sample to form a plurality of dimension measurement patterns in the member to be patterned, each of the dimension measurement patterns having a first actual pattern corresponding to the first sub test pattern and a second actual pattern corresponding to the second sub test pattern; and
   measuring a dimension difference between a reference side of the first actual pattern and a side corresponding to the reference side in the second actual pattern with respect to each of the plurality of dimension measurement patterns in a state where one side of the first actual pattern is set as the reference side.

16. The shot correction method of a charged particle beam writing method according to claim 15, wherein the rectangular shape has a pair of long sides and a pair of short sides.

17. The shot correction method of a charged particle beam writing method according to claim 15, wherein the rectangular shape has a pair of long sides and a pair of short sides, and
   the reference side corresponds to one short side of the rectangular shape.

18. The shot correction method of a charged particle beam writing method according to claim 15, wherein the rectangular shape has a pair of long sides and a pair of short sides, and
   the reference side corresponds to one long side of the rectangular shape.

19. The shot correction method of a charged particle beam writing method according to claim 14, wherein the base data generating step includes a shot size correcting step of extracting a shot of which only a shot size is to be corrected, and correcting data of the shot size, using information which makes it possible to correct only the shot size of the charged particle beam for every shot and information on an extraction condition of a shot to be corrected by the information.

20. The shot correction method of a charged particle beam writing method according to claim 14, wherein the charged particle beam is an electron beam.

* * * * *